United States Patent
Chen et al.

(10) Patent No.: US 7,382,189 B2
(45) Date of Patent: Jun. 3, 2008

(54) MULTI-GAIN AMPLIFIER WITH INPUT IMPEDANCE CONTROL

(75) Inventors: Jinghong Chen, Basking Ridge, NJ (US); Shaorui Li, Summit, NJ (US); Lawrence A. Rigge, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 71 days.

(21) Appl. No.: 11/526,855

(22) Filed: Sep. 25, 2006

(65) Prior Publication Data

US 2008/0074187 A1    Mar. 27, 2008

(51) Int. Cl.
    *H03F 3/45* (2006.01)
(52) U.S. Cl. ........................... 330/253; 330/254
(58) Field of Classification Search ............... 330/253, 330/254, 261, 305, 306
    See application file for complete search history.

(56) References Cited

U.S. PATENT DOCUMENTS

| | | | |
|---|---|---|---|
| 5,343,162 A * | 8/1994 | Davis | 330/252 |
| 6,308,055 B1 * | 10/2001 | Welland et al. | 455/260 |
| 6,995,611 B1 * | 2/2006 | Rokhsaz | 330/252 |
| 7,076,226 B2 * | 7/2006 | Bult et al. | 455/252.1 |
| 7,202,740 B2 * | 4/2007 | Leete | 330/254 |

\* cited by examiner

*Primary Examiner*—Henry Choe
(74) *Attorney, Agent, or Firm*—Mendelsohn & Assoc.; Craig M. Brown; Steve Mendelsohn

(57) ABSTRACT

In one embodiment, an amplifier circuit has at least one branch and current-source circuitry providing a tail current to the branch, which has at least one load tank, at least one input transistor coupled to the load tank, and variable-impedance circuitry coupled between an input node of the amplifier circuit and the gate of the input transistor. The transconductance of the input transistor can be altered to achieve two or more different gain settings for the amplifier circuit. The variable-impedance circuitry can be controlled to contribute any one of at least two different levels of impedance to the overall input impedance of the amplifier circuit. If the transconductance of the input transistor is reduced, then the variable-impedance circuitry can increase the level of impedance contributed to the overall input impedance of the amplifier circuit such that the overall input impedance of the amplifier circuit remains substantially unchanged.

17 Claims, 4 Drawing Sheets

MULTI-GAIN AMPLIFIER WITH INPUT IMPEDANCE CONTROL

BACKGROUND OF THE INVENTION

1. Field of the Invention

The present invention relates to electronics and, more specifically, to amplifiers used in such devices as radio receivers.

2. Description of the Related Art

To accommodate a relatively large, dynamic range in radio receivers, low-noise amplifiers (LNA) are often designed with two gain settings: a high-gain setting and a low-gain setting. FIG. 1 shows a simplified schematic diagram of one implementation of a prior-art LNA 100 with two gain settings. LNA 100 is a differential circuit with left branch 102 and right branch 104, which are mirror images of one another. Additionally, the devices of left branch 102 are chosen to have properties equal to those of the corresponding devices of right branch 104. LNA 100 receives differential input signal $V_{1,IN}$, $V_{2,IN}$ and produces inverted, amplified, differential output signal $V_{1,OUT}$, $V_{2,OUT}$.

To further understand the operation of LNA 100, representation 200 of the input circuitry for each of left branch 102 and right branch 104 is shown in FIG. 2. Typically, the input impedance $Z_{IN}$ of each branch 102 and 104 is matched to the source impedance (e.g., the antenna impedance, typically 50Ω), represented by resistance $R_S$. When the LNA input impedance is matched to $R_S$, the quality-factor $Q_{IN}$ of the LNA input network may be represented by equation (1) as follows:

$$Q_{IN} = \frac{1}{2R_S C_{GS} \omega_0} \quad (1)$$

where $C_{GS}$ is the effective capacitance across the gate to source terminals of each transistor $M_1$ and $\omega_0$ is the desired operating frequency of LNA 100. At resonance, the gate-to-source voltage $V_{GS}$ across each transistor $M_1$ is given by equation (2) as follows:

$$V_{GS} = Q_{IN} V_S \quad (2)$$

where source voltage $V_S$ is a source voltage. Additionally, the output voltage $V_{OUT}$ (e.g., $V_{1,OUT}$ and $V_{2,OUT}$) of each branch 102 and 104 may be expressed by equation (3) as follows:

$$V_{OUT} = g_m R_L V_{GS} \quad (3)$$

where $R_L$ is the effective load resistance of each load tank 106 at frequency $\omega_0$ and $g_m$ is the transconductance of each transistor $M_1$. Thus, the overall voltage gain $A_V$ of the LNA 100 may be expressed by equation (4) as follows:

$$A_v = \frac{V_{OUT}}{V_S} = \frac{V_{OUT}}{V_{GS}} \times \frac{V_{GS}}{V_S} = \frac{g_m R_L}{2 R_S C_{GS} \omega_0} \quad (4)$$

Typically, the voltage gain of LNA 100 is switched between high gain and low gain by changing the effective load resistance $R_L$ of the right and left load tanks 106. In FIG. 1, the transconductance $g_m$, resistance $R_S$, gate-to-source capacitance $C_{GS}$, and resonant frequency $\omega_0$ are held constant; therefore, as the effective load resistance $R_L$ is decreased, the voltage gain also decreases.

Changing the effective load resistance $R_L$ of the right and left load tanks 106 is accomplished in FIG. 1 by controlling switch $S_1$ in each load tank 106. In the high-gain setting, both switches $S_1$ are open and both resistors $R_1$ are effectively removed from each load tank 106. In the low-gain setting, both switches $S_1$ are closed, thereby effectively adding both resistors $R_1$ to the load tanks and decreasing the effective load resistance $R_L$.

In this implementation, the tail current $I_{TAIL}$ flowing through each input transistor $M_1$ is held constant between the high-gain setting and the low-gain setting, such that the transconductance $g_m$ is unchanged. Consequently, power consumption between the high-gain setting and low-gain setting also does not change.

SUMMARY OF THE INVENTION

In one embodiment, the present invention is an integrated circuit comprising an amplifier circuit adapted to receive an input signal at least one input node and present an amplified output signal at least one output node. The amplifier circuit comprises at least one branch and current-source circuitry adapted to provide a tail current to the at least one branch. Each branch comprises at least one load tank, at least one input transistor, and variable-impedance circuitry. The at least one input transistor has a gate and is coupled to the at least one load tank, wherein the transconductance of the at least one input transistor is adapted to be altered to achieve two or more different gain settings for the amplifier circuit. The variable impedance circuitry is coupled between the input node and the gate of the input transistor, wherein the variable-impedance circuitry is adapted to be controlled to contribute any one of at least two different levels of impedance to the overall input impedance of the amplifier circuit.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
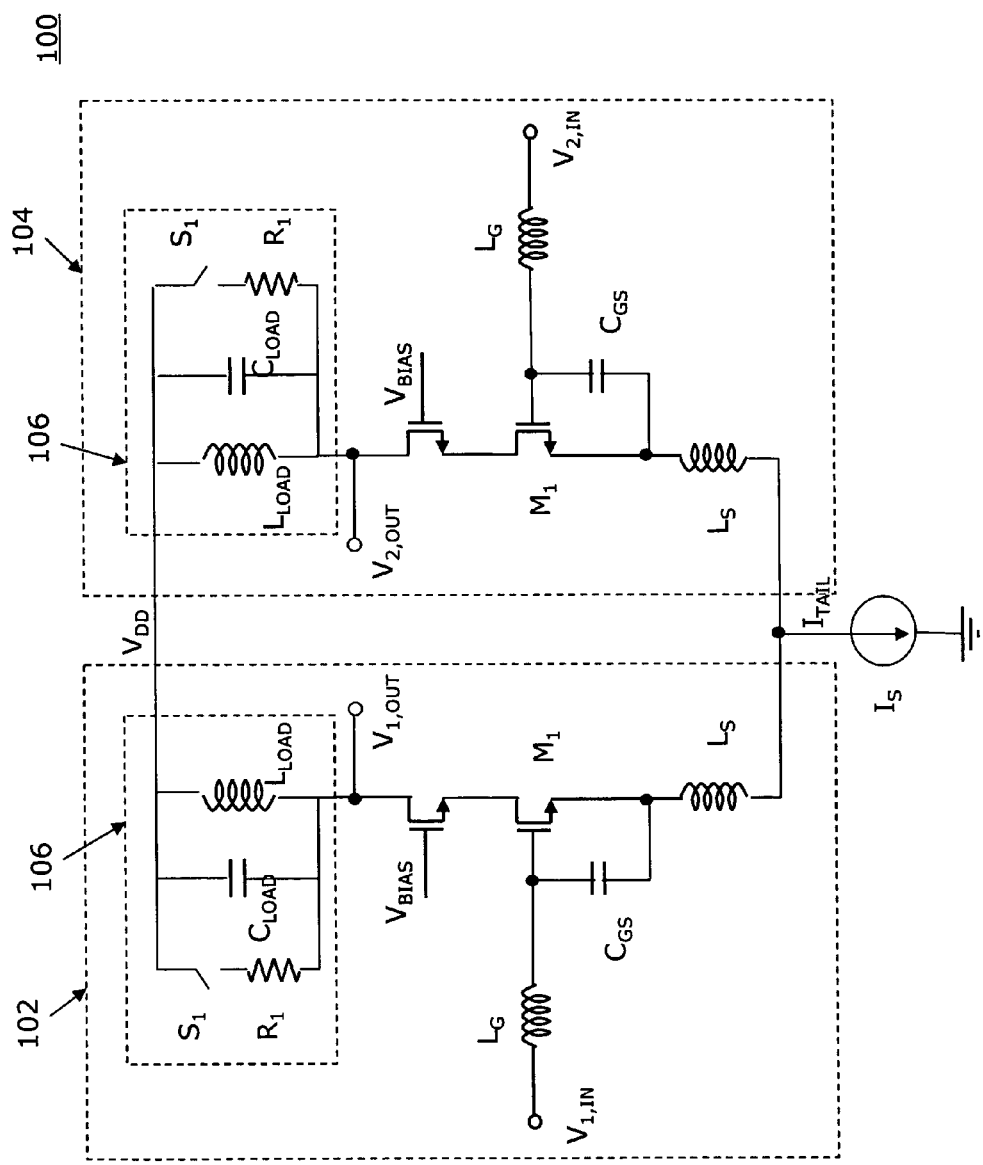
FIG. 1 shows a simplified schematic diagram of a prior-art, differential LNA circuit with two gain settings.

A second method of reducing gain may be envisioned in which the transconductance $g_m$ of each transistor $M_1$ in FIG. 1 is reduced. As shown in equation (4), the gain decreases as the transconductance $g_m$ decreases. One way to reduce the transconductance $g_m$ of each input transistor $M_1$ is to reduce the tail current $I_{TAIL}$, which also advantageously lowers the power consumption in the low-gain setting.

A disadvantage of reducing the transconductance $g_m$ in the low-gain setting is impedance mismatching. In circuitry design, matching impedances is often desired to eliminate signal reflections between upstream and downstream circuitry. As a result, standards have been established for matching impedances for various applications. For example, in radio frequency (RF) applications, circuitry is typically designed to the S11 design specification, which requires input and output impedances of about 50Ω.

The input impedance $Z_{IN}$ of left branch 102 and right branch 104 of LNA 100 may each be represented by equation (5) as follows:

$$Z_{IN} = \frac{g_m L_S}{C_{GS}} + j\left[\omega(L_S + L_G) - \frac{1}{\omega C_{GS}}\right]. \tag{5}$$

Figure 2:
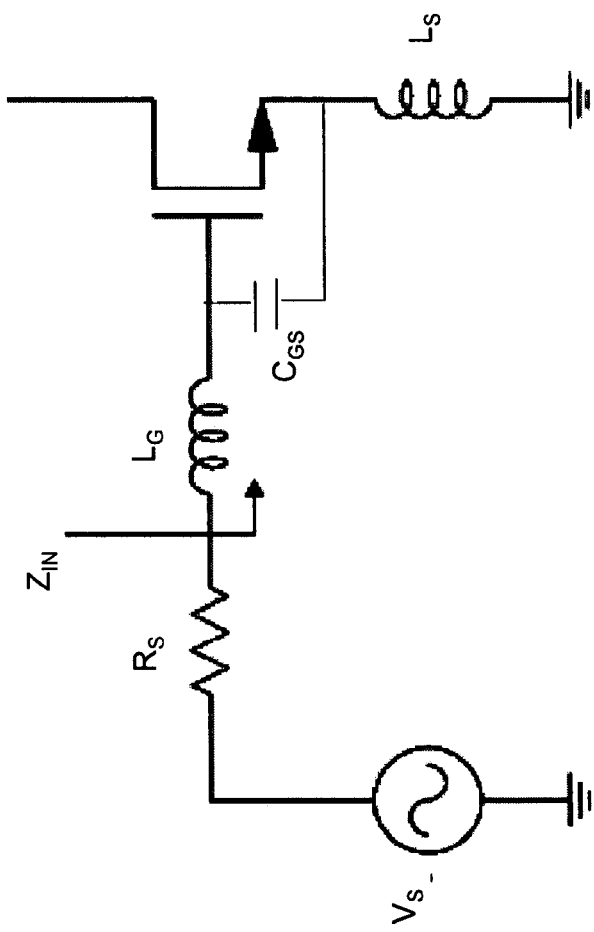
FIG. 2 shows a representation of the input circuitry for each branch of the prior-art, differential LNA circuit of FIG. 1.

The gate inductance $L_G$, and source inductance $L_S$ shown in FIG. 1 and FIG. 2 are used to achieve simultaneous input and noise matching and to provide the desired input resistance (e.g., 50Ω). The gate inductor $L_G$ and source inductor $L_S$ can each be implemented using either on-chip or off-chip inductors.

To meet the S11 standard, the real part of equation (5) must be equal to about 50Ω and the imaginary part of equation (5) must be equal to about 0. These two conditions are represented below as equations (6) and (7):

$$\frac{g_m L_S}{C_{GS}} \cong 50\Omega \tag{6}$$

$$\omega^2(L_S + L_G) \cong \frac{1}{C_{GS}}. \tag{7}$$

As shown by equation (6), as the transconductance $g_m$ decreases, $Z_{IN}$ decreases below the 50Ω standard for fixed values of $L_S$ and $C_{GS}$.

Figure 3:
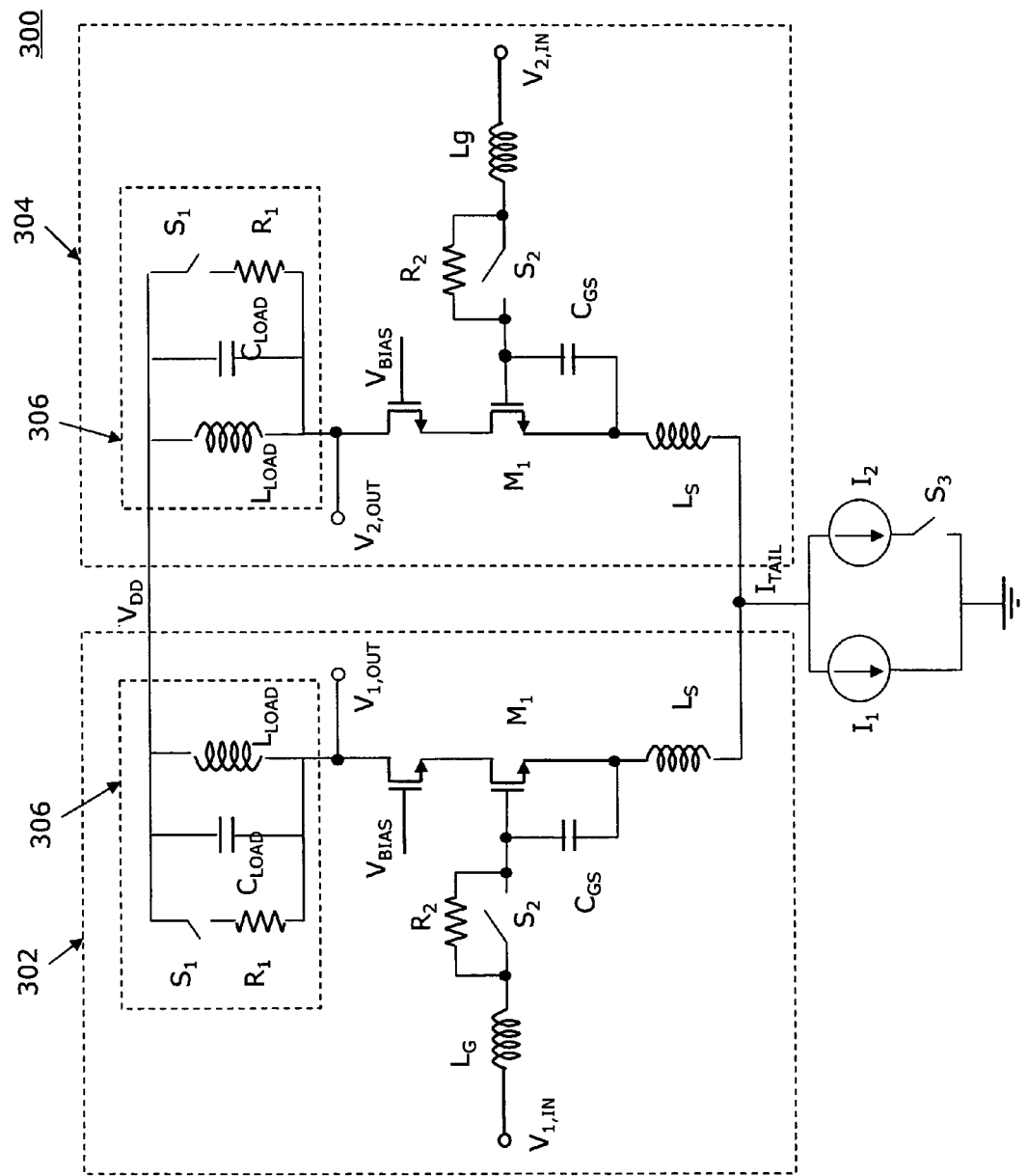
FIG. 3 shows a simplified schematic diagram of a differential LNA circuit with two gain settings according to one embodiment of the present invention.

According to certain embodiments of the present invention, impedance matching is maintained while decreasing the transconductance $g_m$ to reduce power consumption in the low-gain setting. FIG. 3 shows a simplified schematic of an LNA circuit 300 with two gain settings according to one embodiment of the present invention. Similar to prior-art LNA 100, LNA 300 is a differential circuit with left branch 302 which is a mirror image of right branch 304, where the devices of left branch 302 are chosen to have properties equal to those of the corresponding devices of right branch 304. LNA 300 receives differential input signal $V_{1,IN}$, $V_{2,IN}$ and produces inverted, amplified, differential output signal $V_{1,OUT}$, $V_{2,OUT}$.

In this embodiment, the transconductance $g_m$ of each input transistor $M_1$ is altered by changing tail current $I_{TAIL}$. $I_{TAIL}$ is selectively generated by one or two current sources: $I_1$ which is always on and $I_2$ which may be selectively disconnected by switch $S_3$. In the low-gain setting, switch $S_3$ is open to disconnect current source $I_2$ and thus tail current $I_{TAIL}$ is generated by only current source $I_1$. The resulting transconductance $g_m$ of each input transistor $M_1$ is also reduced.

As shown in equation (5), as the transconductance $g_m$ is reduced, the input impedance $Z_{IN}$ is also reduced. To maintain constant input impedance $Z_{IN}$, switches $S_2$ and resistors $R_2$ are added to the inputs of right branch 302 and left branch 304. To compensate for the reduced input impedance $Z_{IN}$ in the low-gain setting, both switches $S_2$ are opened so that the differential input signal flows through both resistors $R_2$. As a result, equation (6) may be modified to represent the input impedance when switches $S_2$ are open as shown in equation (8) below:

$$\frac{g_m L_S}{C_{GS}} + R_2 \cong 50\Omega. \tag{8}$$

Note that $R_2$ is selected during design of the circuit to maintain the 50Ω S11 standard. Also, note that equation (7) is not affected by the reduction of transconductance $g_m$.

In the high-gain setting, switch $S_3$ is closed, tail current $I_{TAIL}$ is generated by $I_1$ and $I_2$, and transconductance $g_m$ is restored. With switches $S_2$ closed to short-circuit resistors $R_2$, the input impedance $Z_{IN}$ is restored to equation (6).

Alternative embodiments of the present invention may be realized which reduce the transconductance $g_m$ of one or more input transistors $M_1$ in the low-gain setting and utilize the input impedance matching mechanism described above. These embodiments include but are not limited to the following implementations and any combination thereof.

In several possible implementations, the transconductance $g_m$ may be reduced using alternative methods. For example, the transconductance $g_m$ may be reduced by replacing each input transistor $M_1$ with a set of two or more parallel transistors. One or more of the parallel transistors would be switched so that they could be removed from the circuit, thereby decreasing transconductance $g_m$. The transconductance $g_m$ could also be decreased by disconnecting multiple current sources in a circuit with more than two current sources. Additionally, the transconductance $g_m$ can be reduced by using programmable current sources that have selectable current levels. Other methods of reducing the transconductance $g_m$ can be envisioned by those skilled in the art.

In other possible implementations, the input impedance may be adjusted by using one or more transistors as resistive devices.

In another possible implementation, the low-gain setting may be achieved by reducing the transconductance $g_m$ using one of the methods described above and by reducing the load impedance $Z_{LOAD}$ using the method described in the "Background of the Invention." For example, resistors $R_1$ and switches $S_1$ may be added in parallel to right and left load tanks 306 as illustrated in FIG. 3.

In yet other possible implementations, LNA 300 of FIG. 3 may be a single-ended circuit instead of a differential circuit. In this case, the LNA would contain only one branch.

In still other possible implementations, the implementations described above could be combined to achieve three or more gain levels. For example, two or more resistive devices may be added to the input and three or more current sources, at least two of which are switched, may used to achieve three or more gain settings.

Additionally, the present invention may be altered with alternative circuit configurations and elements by those skilled in the art without deviating from the spirit of this invention. For example, FIG. 3 depicts parallel resistor-inductor-capacitor (RLC) load tanks. Other loads such as inductively enhanced RC loads, resistor loads, and active inductor loads may be envisioned by those skilled in the art.

Furthermore, alternative embodiments of the present invention may be realized in which the input impedance is controlled to achieve different desired impedance levels rather than simply maintaining a constant input impedance.

Although the present invention has been described as being implemented using NMOS transistor technology, the present invention can also be implemented using PMOS transistors or other transistor technologies, such as bipolar or other integrated circuit (IC) technologies such as GaAs, InP, GaN, and SiGe IC technologies.

It will be further understood that various changes in the details, materials, and arrangements of the parts which have been described and illustrated in order to explain the nature of this invention may be made by those skilled in the art without departing from the scope of the invention as expressed in the following claims. For example, the switches identified in FIG. 3 may be implemented using different methods, including single transistors and transistor pass gates. Additionally, this invention was discussed in terms of multiple voltage gain settings. Other types of gain settings may be realized without deviating from the scope of this invention.

LNA 300 of FIG. 3 has been discussed relative to its use in an RF receiver. In general, LNAs of the present invention can be implemented in a wide variety of different types of circuitry, including, but not limited to receivers, transmitters, and transceivers. Moreover, circuits embodying LNAs of the present invention can be implemented in a wide variety of applications, including any suitable consumer product or other suitable apparatus.

Figure 4:
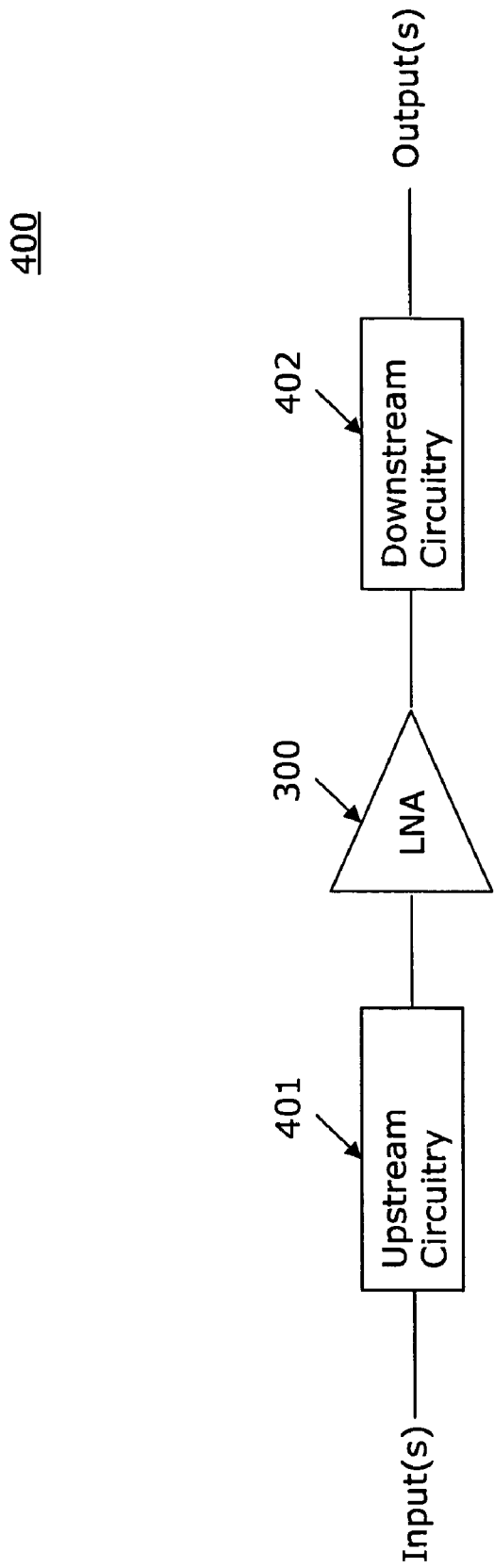
FIG. 4 shows a simplified block diagram of a representation of an apparatus in which the LNA of FIG. 3 may be practiced.

FIG. 4 shows a simplified block diagram of a representation of an apparatus 400 in which LNA 300 may be practiced. As shown in FIG. 4, in addition to LNA 300, apparatus 400 comprises at least one of upstream circuitry 401 and downstream circuitry 402. For example, in one possible implementation where apparatus 400 includes receiver circuitry having LNA 300, upstream circuitry 401 might include a band-select filter that receives and processes one or more input signals from an antenna (not shown). After amplification by LNA 300, the received signals are processed by downstream circuitry 402, which might include image-reject filtering, mixing, channel-select filtering, analog-to-digital conversion, and other processing for recovering one or more output data streams from the received signals. Note that more than one LNA 300 may be used in such a receiver. Additionally, note that any one of the alternative embodiments of LNA 300 discussed above may be used in place of LNA 300.

Further devices such as RF transmitters and RF transceivers may use either LNA 300 or any of the alternative embodiments. Moreover, the present invention may be used in receivers, transmitters, and transceivers in applications other than RF. These applications include but are not limited to radio frequency applications, millimeter wave applications, microwave applications, fiber optic applications, and coaxial cable applications. Additional applications commonly known in the art may also be envisioned within the scope of this invention.

The present invention may be implemented as circuit-based processes, including possible implementation as a single integrated circuit (such as an ASIC), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. Apparatus comprising an amplifier circuit adapted to receive an input signal at least one input node (e.g., $V_{1,IN}$) and present an amplified output signal at least one output node (e.g., $V_{1,OUT}$), the amplifier circuit comprising at least one branch (e.g., 302) and current-source circuitry (e.g., $I_1$, $I_2$, $S_3$) adapted to provide a tail current to the at least one branch, each branch comprising:

at least one load tank (e.g., 306);

at least one input transistor (e.g., $M_1$) having a gate and coupled to the at least one load tank, wherein transconductance of the at least one input transistor is adapted to be altered to achieve two or more different gain settings for the amplifier circuit; and variable-impedance circuitry (e.g., $R_2$, $S_2$) coupled between the input node and the gate of the input transistor, wherein the variable-impedance circuitry is adapted to be controlled to contribute any one of at least two different levels of impedance to overall input impedance of the amplifier circuit.

2. The invention of claim 1, wherein the amplifier circuit is a single-ended circuit having one branch.

3. The invention of claim 1, wherein the amplifier circuit is a differential circuit having two branches, each branch having a corresponding input node and a corresponding output node of the amplifier circuit.

4. The invention of claim 1, wherein the current-source circuitry is adapted to be controlled to provide any one of at least two different levels for the tail current applied to the at least one branch to alter the transconductance of the at least one input transistor.

5. The invention of claim 4, wherein the current-source circuitry comprises two or more parallel current sources of which one or more is adapted to be switched off to reduce the tail current through the at least one input transistor.

6. The invention of claim 5, wherein the current-source circuitry comprises (1) a first current source (e.g., $I_1$) in parallel with (2) a series combination of a second current source (e.g., $I_2$) and a switch (e.g., $S_3$), such that:

if the switch is closed, then (i) the tail current is generated by both the first current source and the second current source and (ii) the amplifier circuit is configured to operate in a high-gain setting; and if the switch is open, then (i) the tail current is generated by only the first current source and (ii) the amplifier circuit is configured to operate in a low-gain setting.

7. The invention of claim 1, wherein the variable-impedance circuitry comprises a resistor (e.g., $R_2$) in parallel with a switch (e.g., $S_2$), such that:

if the switch is closed, then the resistor does not contribute resistance to the overall input impedance of the amplifier circuit; and if the switch is open, then the resistor contributes resistance to the overall input impedance of the amplifier circuit.

8. The invention of claim 1, wherein the at least one load tank comprises (i) a series combination of a switch (e.g., $S_1$) and a resistor (e.g., $R_1$) in parallel with (ii) other load tank circuitry, such that, if the switch is closed, then (1) the overall impedance of the at least one load tank is smaller and (2) the gain of the amplifier circuit is smaller, than if the switch is open.

9. The invention of claim 1, wherein, if the transconductance of the at least one input transistor is reduced, then the variable-impedance circuitry is adapted to increase the level of impedance contributed to the overall input impedance of the amplifier circuit such that the overall input impedance of the amplifier circuit remains substantially unchanged.

10. The invention of claim 1, wherein:

the current-source circuitry comprises (1) a first current source (e.g., $I_1$) in parallel with (2) a series combination of a second current source (e.g., $I_2$) and a first switch (e.g., $S_3$), such that:

if the first switch is closed, then (i) the tail current is generated by both the first current source and the second current source and (ii) the amplifier circuit is configured to operate in a high-gain setting; and if the first switch is open, then (i) the tail current is generated by only the first current source and (ii) the amplifier circuit is configured to operate in a low-gain setting;

the variable-impedance circuitry comprises a resistor (e.g., $R_2$) in parallel with a second switch (e.g., $S_2$), such that:

if the second switch is closed, then the resistor does not contribute resistance to the overall input impedance of the amplifier circuit; and if the second switch is open, then the resistor contributes resistance to the overall input impedance of the amplifier circuit.

11. The invention of claim 10, wherein the at least one load tank comprises (i) a series combination of a third switch (e.g., $S_1$) and an other resistor (e.g., $R_1$) in parallel with (ii) other load tank circuitry, such that, if the third switch is closed, then (1) the overall impedance of the at least one load tank is smaller and (2) the gain of the amplifier circuit is smaller, than if the switch is open.

12. The invention of claim 10, wherein, if the transconductance of the at least one input transistor is reduced by opening the first switch, then the variable-impedance circuitry is adapted to increase the level of impedance contributed to the overall input impedance of the amplifier circuit by opening the second switch such that the overall input impedance of the amplifier circuit remains substantially unchanged.

13. The invention of claim 10, wherein the amplifier circuit is a differential circuit having two branches, each branch having an input node and an output node of the amplifier circuit.

14. The invention of claim 1, wherein the apparatus is an integrated circuit comprising the amplifier circuit.

15. The invention of claim 1, wherein the apparatus comprises an integrated circuit comprising the amplifier circuit.

16. The invention of claim 15, wherein the apparatus is a consumer product.

17. An amplifier circuit adapted to receive an input signal at least one input node (e.g., $V_{1,IN}$) and present an amplified output signal at least one output node (e.g., $V_{1,OUT}$), the amplifier circuit comprising at least one branch (e.g., 302) and current-source circuitry (e.g., $I_1$, $I_2$, $S_3$) adapted to provide a tail current to the at least one branch, each branch comprising:

at least one load tank (e.g., 306);

at least one input transistor (e.g., $M_1$) having a gate and coupled to the at least one load tank, wherein transconductance of the at least one input transistor is adapted to be altered to achieve two or more different gain settings for the amplifier circuit; and variable-impedance circuitry (e.g., $R_2$, $S_2$) coupled between the input node and the gate of the input transistor, wherein the variable-impedance circuitry is adapted to be controlled to contribute any one of at least two different levels of impedance to overall input impedance of the amplifier circuit.

* * * * *